United States Patent [19]

Tsay

[11] Patent Number: 5,497,348
[45] Date of Patent: Mar. 5, 1996

[54] BURN-IN DETECTION CIRCUIT

[75] Inventor: Ching-yuh Tsay, Richardson, Tex.

[73] Assignee: Texas Instruments Incorporated, Dallas, Tex.

[21] Appl. No.: 250,886

[22] Filed: May 31, 1994

[51] Int. Cl.[6] .................................................. G11C 7/00
[52] U.S. Cl. ................ 365/189.09; 365/201; 365/189.07
[58] Field of Search ...................... 365/189.09, 189.06, 365/189.07, 201, 189.11; 327/315, 316, 534, 538

[56] References Cited

U.S. PATENT DOCUMENTS

| | | | |
|---|---|---|---|
| 5,063,304 | 11/1991 | Iyengar | 307/296.6 |
| 5,087,834 | 2/1992 | Tsay | 307/443 |
| 5,103,159 | 4/1992 | Breugnot et al. | 323/315 |
| 5,119,337 | 6/1992 | Shimizu et al. | 365/201 |
| 5,120,993 | 6/1992 | Tsay et al. | 307/296.4 |
| 5,159,206 | 10/1992 | Tsay et al. | 307/272.3 |
| 5,168,209 | 12/1992 | Thiel | 323/313 |
| 5,220,534 | 6/1993 | Redwine et al. | 365/226 |
| 5,233,161 | 8/1993 | Farwell et al. | 219/209 |
| 5,300,824 | 4/1994 | Iyengar | 307/296.3 |
| 5,321,653 | 6/1994 | Suh et al. | 365/189.09 |
| 5,367,491 | 11/1994 | Han et al. | 365/201 |
| 5,373,472 | 12/1994 | Ohsawa | 365/201 |

Primary Examiner—David C. Nelms
Assistant Examiner—Vu A. Le
Attorney, Agent, or Firm—W. Daniel Swayze, Jr.; W. James Brady, III; Richard L. Donaldson

[57] ABSTRACT

A burn-in detection circuit include a first divider circuit to divide a first reference to form a divider voltage. A comparator compares the divider voltage with a second reference voltage to reduce the divider voltage based on the comparator. The comparator include a second divider circuit to be switched in parallel with a portion of said first divider circuit.

4 Claims, 2 Drawing Sheets

BURN-IN DETECTION CIRCUIT

TECHNICAL FIELD OF THE INVENTION

This invention relates to a semiconductor memory device and more particularly to a circuit for increasing potential at a time of a burn-in test to a value higher than at normal operation time.

BACKGROUND OF THE INVENTION

In recent years, the density of components that are integrated into single integrated circuit devices has increased at a high rate. Examples of such high density circuits include dynamic random access memories (DRAMS) which are now being fabricated at 4 MBIT and 16 MBIT single chip densities. In order to accommodate such complexities, while maintaining the size of the chip at reasonable and manufacturable levels, the minimum feature size of transistors and other components of course must be reduced. For DRAM devices which have generally been most densely integrated device in the industry, the size of the feature such as MOS transistor gates is generally at the smallest size manufacturable by available technology. In the example of 16 MBIT DRAM devices, transistor gate lengths are expected to be within the range of 0.5 to 0.7 microns.

It is well known that MOS transistors, which have gate widths and accordingly transistor channel lengths, which are sub-micron dimensions, are subject to time and voltage dependent phenomena to which larger transistors are not subject. An example of such phenomena is transistor performance degradation due to hot-carder effects. While certain techniques are available to reduce the susceptibility of transistors to channel hot-carder effects, such as providing graded junction as described in U.S. Pat. No. 4,356,623, the drain to source voltage normally applied to the transistor structure remains a strong factor in the channel hot-carrier degradation of the transistor performance. Furthermore, the storage element of DRAMS is commonly a thin film capacitor, and it is well known that the data stored within the data DRAM capacitors may be upset by naturally occurring alpha particles. The degree to which data is lost in such events depends upon the capacitance of the memory cell, and accordingly, the capacitance of the modern DRAM cells is generally maintained above 35 fF for each cell and preferably above 50 fF. Since it is desirable that the density of storage cells per unit area should be as large as possible, in order to maintain the necessary storage capacity of 35 to 50 fF, the thickness of the capacitor dielectric must be reduced. Modern storage capacitors thus have the dielectric thickness on the order of the equivalent of 10 nm of silicon dioxide or less. However, with such thin capacitor dielectric, both dielectric breakdown voltage and time dependent dielectric breakdown rates degrade with thinner dielectrics, consuming a constant voltage applied across.

For these reasons, the power supply voltages across such high density VLSI devices including DRAMS, other memories and logic devices, are preferably reduced as the feature size decreases. In addition, since the power dissipation of the chip increases with increasing number of components integrated into the chip, a reduced power supply voltage will also reduce the device power dissipation. Many other circuits may still use the higher power supply voltages, for example 5 volts normally, then is desired by the high density components described above, for example, 3.3 volts, which makes the designer of systems incorporating these devices reluctant to provide an additional power supply to the system due to the cost of such other supplies and the routing of additional bias voltage.

It also should be noted that it is desirable that the performance of the integrated circuit should not vary strongly with the power supply voltage applied thereto. Such variation may increase the cost of production testing of the chip during its manufacture, but such variation may also cause system-level problems for the user.

Furthermore, in the field of DRAM devices, due to the large amount of thin capacitor dielectric on each device, manufacturing generally perform a "burn-in" operation during the test process of the chips. Burn-in is intended to stress the device, both by voltage and by temperature so that weak devices are removed from the population which is shipped to the user of the devices, for example, removing the "infant mortality" portion of the reliability curve. On chip regulation of the bias voltage for the memory array, for example will preclude the direct application of the power supply voltage to the capacitors. Hence, another means of providing the burn-in voltage to the capacitors must be provided. In order to determine when to apply such accelerated burn-in voltage to the capacitors, a burn-in detection circuit is also required in order to determine the switching of internal supply voltage.

FIG. 1 illustrates an example of burn-in detection circuits with a series of P-channel transistors 64, 66, 68 and 60 to detect the voltage, $V_{DD}$, larger than N (where N is the number of P-channel transistors) times the threshold voltage of a P-channel transistor plus 3.3 volts. The circuit of FIG. 1 additionally has a feedback path through N-channel transistor 62 to provide hysteresis. During normal operations, when $V_{DD}$ is less than 3.3 volts plus N times the threshold voltage of a P-channel transistor, the trip point of the circuit, none of the P-channel transistor in series is turned on to conduct current. Hence N-channel transistor 70 is able to discharge node 50 to low and maintain its state. As node 50 is at logically low state, BINEN_ is high and BINEN is low. Thus, N-channel transistor 62 is also turned on to further maintain node 50 at low state. In burn-in test mode, when Vdd is raised sufficiently above the trip point, the conduction current through the seriesly connected P-channel transistors becomes large enough to overdrive the conduction currents generated by N-channel transistors 70 and 62 to charge node 50 higher to invert the states of signals BINEN_and BINEN. As node BINEN_is inverted from high to low during burn-in test operation, N-channel transistor 62 is turned off, hence reducing the pull down current at node 50. As a result, the trip point for returning to normal node is slightly changed, hence a hysteresis is generated. The circuit of FIG. 1 is sensitive to variations of the threshold voltage due to nonuniformity introduced in the manufacturing phase and due to ambient temperature change. Furthermore, the variations of the threshold voltage for P-channel transistors 64, 66, 68 and 60 are multiplied by N where N is the number in the series of transistors. Since a burn-in detection circuit needs to operate over a wide range of temperatures and with good manufacturing tolerances, the approach of FIG. 1 is inadequate to meet all the needs of the user.

SUMMARY OF THE INVENTION

The present invention provides a burn-in detection circuit that is not sensitive to temperature and process or manufacturing variations and may operate over a wide range of temperatures with good manufacturing tolerances. The present invention includes a memory device to produce a burn-in detection signal, including a first reference generator circuit for producing a first reference voltage, a first voltage divider circuit coupled to the first reference generator circuit to divide the first reference voltage to form a first divided reference voltage, a second reference generator circuit for producing a second reference voltage, a comparator coupled to the first voltage divider circuit and the second reference generator circuit for comparing the first divided reference voltage and the second reference voltage and for responding to the comparison of the first divider reference voltage and the second reference voltage to reduce the divided reference voltage.

DESCRIPTION OF THE DRAWINGS

These and other features of the invention will be apparent to those skilled in the art from the following detailed description of the invention taken together with the accompanying drawings in which.

DETAILED DESCRIPTION OF THE INVENTION

The present invention and its advantages are understood by referring to FIGS. 1–4 of the drawings, like numerals being used for like and corresponding parts of the various drawings.

Figure 1:
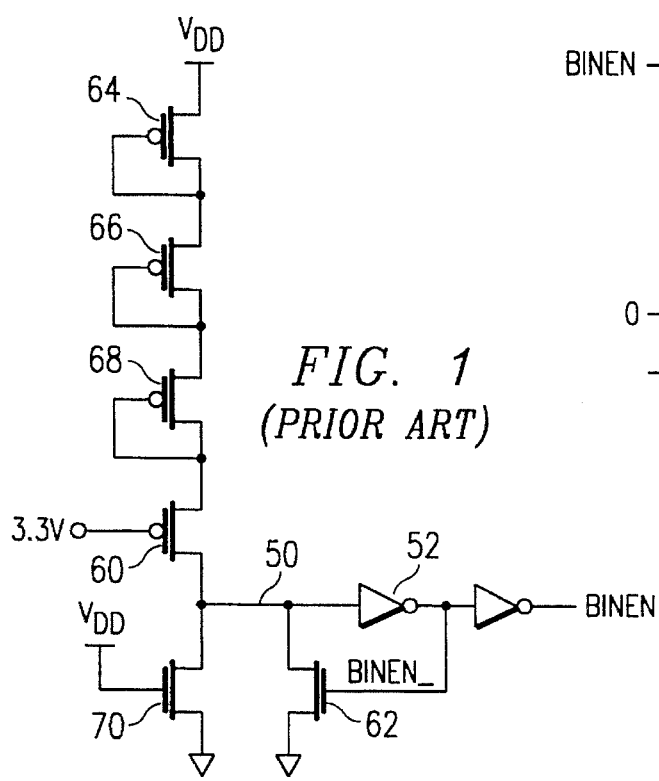
FIG. 1 illustrates a burn-in detection circuit that is sensitive to threshold voltage variations.
Figure 4:
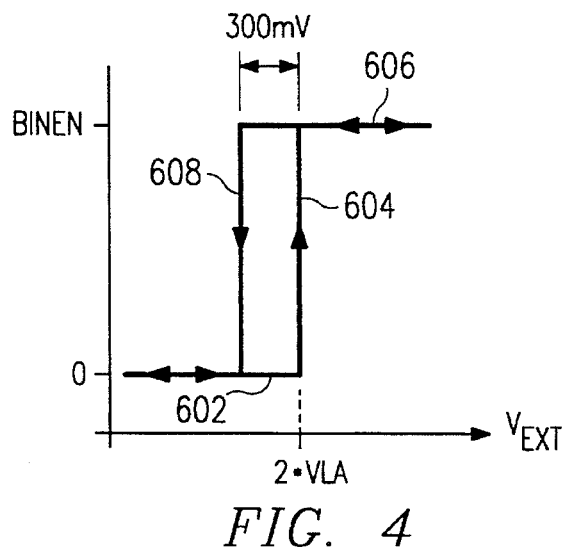
FIG. 4 illustrates a relationship between the voltage, $V_{EXT}$ and the burn-in detection signal, $V_{BINEN}$.
Figure 2:
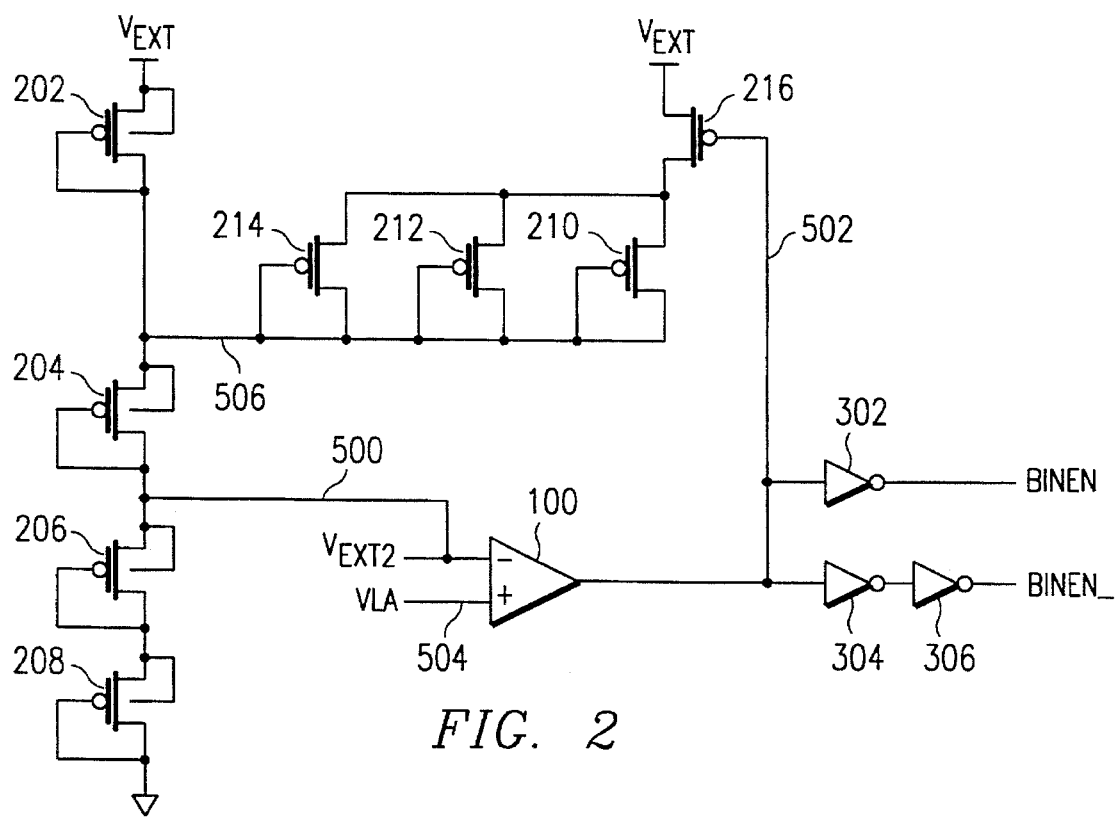
FIG. 2 illustrates a burn-in detection circuit of the present invention.

FIG. 2 illustrates comparator 100 is connected through node 502 to inverters 302 and 304 and the gate of P-channel transistor 216, and through node 500 to the gate and the drain of P-channel transistor 204 and the source of P-channel transistor 206 and through node 504 which is biased at the voltage $V_{LA}$ to compare the voltages between node 500 and node 504 and provides a result and indication of the comparison on node 502. $V_{LA}$ may be derived from other voltage reference such as bandgap reference through some multiplier circuit to provide direct reference for on-chip voltage regulation. P-channel transistor 202 has a source of the transistor 202 connected to external voltage supply $V_{EXT}$ to provide a voltage drop across its source and drain. The drain of the transistor 202 is connected at the node 506 to the source of P-channel transistor 204, the gate and drain of P-channel transistor 204 is connected through node 500 to the source of P-channel transistor 206 to provide a voltage drop across its source and drain. The drain of transistor 206 and the gate of transistor 206 are connected to the source of P-channel transistor 208 to provide a voltage drop across its source and drain and the gate and drain of transistor 208 are connected to ground to provide a voltage drop across its source and drain. The gate and drain of transistor 204 are connected to an input of comparator 100 and this input of comparator 100 is biased at $V_{EXT2}$ level. Another input of comparator 100 is biased at the voltage level of $V_{LA}$. The gate and drain of transistor 202 are connected to the gate and drain of P-channel transistor 214, the gate and drain of P-channel transistor 212 and the gate and drain of P-channel transistor 210. The sources of transistors 210, 212 and 214 are connected to the drain of P-channel transistor 216. The gate of P-channel transistor 216 is connected through node 502 to the output of the comparator 100. The drain of P-channel transistor 216 is connected to $V_{EXT}$. The series connection of transistors 202, 204, 206 and 208 form a voltage divider circuit so as to divide the voltage $V_{EXT}$ to generate $V_{EXT2}$ level. The parallel transistors 210, 212 and 214 when connected to $V_{EXT}$ through transistor 216 alter the voltage drop across transistor 202 and effectively change the division ratio between $V_{EXT2}$ and $V_{EXT}$ of the original voltage divider circuit. The sources of transistors 210, 212 and 214 are connected to the drain of transistor 216, which forms a switch in order to switch in and out the parallel transistors 210, 212 and 214 to form a parallel connection to transistor 202. The source of transistor 216 is connected to $V_{EXT}$. The gate of transistor 216 is connected to the output of comparator 100 at node 502 so that comparator 100 may control the switching of the parallel transistors 210, 212 and 214 by transistor 216. The burn-in signal of the burn-in detection circuit is obtained from the output of inverter 302; the inverter 302 is connected to the output of the comparator 100 through node 502. Inverter 304 is connected to the output of the comparator 100 through node 502 and the output of the inverter 304 is connected to the input of the inverter 306 to produce the inverse burn-in signal, $V_{BINEN}$ of the burn-in signal $V_{BINEN}$. If the voltage $V_{EXT2}$ is less than the voltage $V_{LA}$ by more than the offset voltage of comparator 100, then the output of comparator 100 is $V_{EXT}$ or logical high, the parallel transistors 210, 212 and 214 are switched out of the circuit by transistor 216. The voltage at node 500 is one-half of the voltage $V_{EXT}$, when transistor 216 is turned off, since the first voltage divider circuit formed by transistors 202, 204, 206 and 208 divides $V_{EXT}$ by one-half at node 500 to generate $V_{EXT2}$ voltage level. The output of the inverter 302 is logically at a low level to indicate the no burn-in condition. As $V_{EXT2}$ rises to exceed $V_{LA}$ by more than the offset voltage of comparator 100, the comparator 100 switches from a high output level to a logical low level at node 502. The logical low at node 502 switches transistor 216 on so that the sources of transistors 210, 212 and 214 are connected to the external voltage. This places transistors 210, 212 and 214 in parallel with transistor 202, raising the voltage at node 500 by delta volts. Thus the voltage $V_{EXT2}$ has been raised from $V_{EXT}/2$ to $V_{EXT}/2 + \Delta$. Since $V_{EXT2}$ level is increased by delta volts, it is even larger than $V_{LA}$, hence, the output of the comparator 100 is still logical high maintaining the parallel connection of transistors 210, 212 and 214 with transistor 202. Hence, the burn-in entry trip point is at $V_{EXT}/2 = V_{LA}$, or $V_{EXT} = 2*V_{LA}$. As $_{EXT2}$, now at $(V_{EXT}/2) + \Delta$ level, drops below $V_{LA}$, the comparator 100 outputs a logical high signal to node 502. This output logical high signal turns off transistor 216 and switch transistors 210, 212 and 214 from being parallel with transistor 202. This reduces $V_{EXT2}$ by $\Delta$ volts to $V_{EXT}/2$ further ensures $V_{EXT2}$ is less than $V_{LA}$, hence maintain no burn-in state. The exit trip point is therefore at $V_{EXT}/2 + \Delta = V_{LA}$ or $V_{EXT} = 2*V_{LA} - 2*\Delta$. The relationship is illustrated in FIG. 4.

Figure 3:
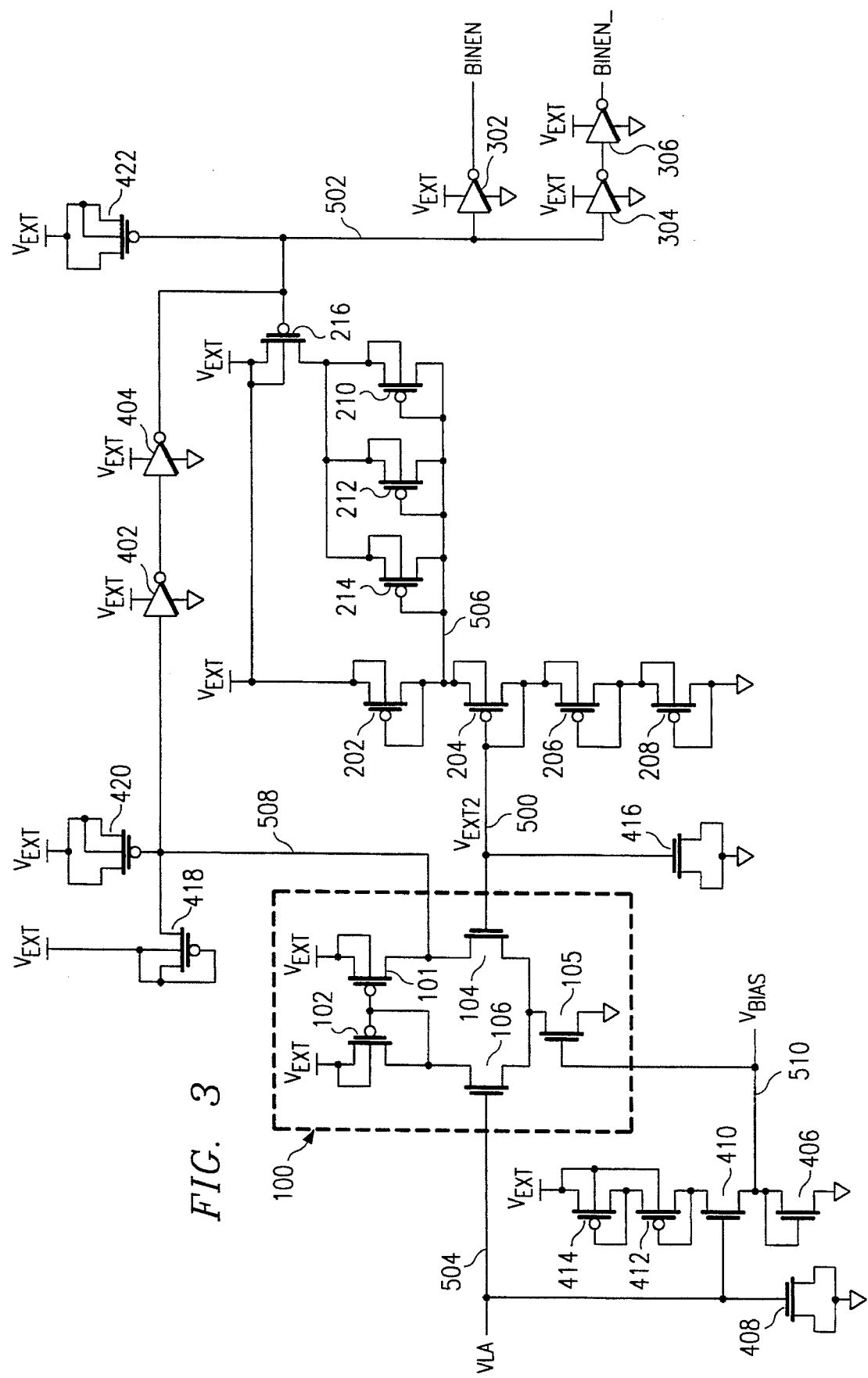
FIG. 3 is a burn-in detection circuit of another embodiment of the present invention.

Referring now to FIG. 3, the comparator of 100 is illustrated. As illustrated in FIG. 3, a comparator 100 of the burn-in detection circuit is configured with the N-channel MOS differential amplifier of transistors 106 and 104 having a current mirror active load of P-channel transistors 101 and 102. Comparator 100 drives node 508 with a voltage depending upon the voltage level of $V_{EXT2}$ relative to the voltage level of $V_{LA}$, input to comparator 100. (Node 504 is connected to comparator 100 by its connection to the gate of N-channel transistor 106). N-channel transistor 104 has its gate connected to node 500 to provide the voltage $V_{EXT2}$ to comparator 100. Node 510 is connected to voltage $V_{BIAS}$ and is connected to the gate of N-channel transistor 105, which has a drain of transistor 105 connected to the sources of transistors 106 and 104, and has a source of transistor 105 connected to ground. P-channel transistor 102 has its source biased at the $V_{EXT}$ and has its drain connected to the drain of transistor 106. Similarly, P-channel transistor 101 has its source biased at $V_{EXT}$ and has its drain connected to the drain of transistor 104. The gates of transistors 102 and 101 are connected to the drains of transistor 102 and 106. The drains of transistors 101 and 104 are connected to node 508, which is input to inverter 402. The W/L ratios of transistors 104 and 106 are preferably matched to one another, for example with W/L on the order of 10, and the ratios of transistors 102 and 101 are preferably well matched, for example with W/L on the order of 15 to 20.

In operation, comparator 100 is enabled by node 510 by the voltage $V_{BIAS}$ being at a DC biasing level larger than the threshold voltage of N-channel transistor, $V_{TN}$. With the voltage at node 510 higher than $V_{TN}$, transistor 105 is turned on and acts as a current source to ground. The sources of transistors 104 and 106 are pulled by transistor 105 to a voltage which is an N-channel threshold voltage $V_{TN}$ below the gate voltage of transistor 104 or 106. This allows transistors 104 and 106 to be conductive/responsive to voltages applied to their respective gates, enabling the operation of comparator 100 to be responsive to the difference voltage between $V_{EXT2}$ and $V_{LA}$ by adjusting the voltage at node 508. As noted above, transistor 105 acts as a current source in comparator 100. As the input voltage $V_{EXT2}$ to node 500 is below the voltage $V_{LA}$ at node 504, transistor 106 will become more conductive than will transistor 104 as a result of the matching in size of transistors 104 and 106. Accordingly, the bulk of the current through the source of transistor 105 will be drawn by transistors 102 and 106 rather than by transistors 101 and 104. In order to satisfy the transistor current-voltage relationships, the high current passing through transistor 102 relative to transistor 101 will cause the voltage at the drain of transistor 101 to rise toward $V_{EXT}$ and will cause the voltage at the drain of transistor 102 to fall toward ground. With the voltage at the drains of transistors 101 and 104 rising, the voltage at node 508 rises toward $V_{EXT}$. This rising voltage at node 508 provide a logical high as input to inverter 402. After two inversions through inverters 402 and 404, node 502 is also driven by node 518 to a logical high level. It is preferable that transistors 104 and 106 be closely match to one another and that transistors 102 and 101 also be closely matched to one another. The source coupled pair transistors 104 and 106 compares the voltages of node 504 and node 500. Differential voltages cause differential current flows in transistors 104 and 106. Thus, varying the potential at node 508. For example, as the voltage $V_{EXT2}$ at node 500 is lower than the voltage $V_{LA}$ at node 504, the current through transistors 101 and 104 decrease. As the current decrease, the voltage at node 508 rises. Capacitor 420 is connected to the external voltage, $V_{EXT}$, and node 508 and diode 418 is connected between the external voltage $V_{EXT}$ and node 508 to help initialize node 508. The input of inverter 402 is connected to the drains of transistors 101 and 104 at node 508 to invert the voltage at 508. The output of inverter 402 is connected to the input of inverter 404 to invert the output of inverter 402. Capacitor 422 is connected to the external voltage $V_{EXT}$ and to the gate of transistor 216 at node 502 to maintain the voltage at node 502. The voltage at node 502 corresponds to the inverse of the burn-in signal. Both inverters 302 and 304 are connected to the output of inverter 404 to invert the inverse of the burn-in signal. The gate of transistor 216 is connected to the output of inverter 404 to switch transistor 216. The output of inverter 304 is connected to the input of inverter 306. The inverter 306 inverts the output of inverter 304 provide an inverse of the burn-in signal. Capacitor 408 is connected to ground and to the gate of transistor 106 at node 504. The gate of transistor 106 is connected to the gate of N-channel transistor 410. The drain of transistor 410 is connected to the drain of P-channel transistor 412. The gate of transistor 412 is connected to the drain of transistor 412 while the substrate of transistor 412 is connected to external voltage, $V_{EXT}$. The source of transistor 412 is connected to the gate and drain of P-channel transistor 414. The source of transistor 414 is connected with the substrate of transistor 414 to the external voltage, $V_{EXT}$. The gate and drain of N-channel transistor 406 is connected to the source of transistor 410 to generate a bias voltage $V_{BIAS}$ at node 510. The source of transistor 406 is connected to ground potential.

As voltage $V_{EXT2}$ is less that the voltage $V_{LA}$ by more than the offset voltage of comparator 100, the node 508 is logical high indicating a no burn-in condition. Thus, the output of inverter 402 is low, and the output of inverter 404 is logical high at node 502. The logical high voltage at node 502 maintains transistor 216 nonconducting so transistors 210, 212 and 214 do not effect the series voltage divider operation of transistors 202, 204, 206 and 208. The output of inverter 304 is logical low since the input of inverter 304 is logical high while the output of inverter 306 is logical high indicating the inverse of burn-in signal. The output of invert 302 is logical low since the input of inverter 302 is logical high indicating the signal of no burn-in condition. If voltage $V_{EXT2}$ is greater than voltage $V_{LA}$ by more than the offset voltage of comparator 100, node 508 is logical low indicating a burn-in condition. The output of inverter 402 is logical high and the output of inverter 404 is logical low providing a logical low signal at node 502. The output of inverter 302 is logical high indicating the signal of a burn-in condition. The output of inverter 304 is logical high while the output of inverter 306 is logical low indicating the inverse signal of the burn-in condition. As the voltage level at node 502 is logical low, transaction 216 is turned on placing the transistors 210, 212 and 214 in parallel configuration with transistor 202. Transistors 202, 204, 206 and 208 are preferably well matched transistors with the same width and length as the transistors 210, 212 and 214. As transistors 210, 212 and 214 are placed in parallel to transistor 202, the voltage $V_{EXT2}$ is increased due to the reduction of source to drain voltage drop across transistor 202 resulting from the effect of the second voltage divider circuit.

Thus, if transistor 216 is off, $V_{EXT2} \sim V_{EXT} \div 2$.

If transistor 216 is on then $V_{EXT2} \sim (V_{EXT} \div 2) + \Delta$.

Referring now to FIG. 4, FIG. 4 illustrates that while transistor 216 is off, the burn-in detection circuit operates according to the relationships as indicated by curve 602 indicating logical low $V_{BINEN}$ or no burn-in condition where voltage $V_{EXT2} = V_{EXT}/2 < V_{LA}$ or $V_{EXT} < 2* V_{LA}$, or $V_{EXT} < 6.6$. As transistor 216 is being turned on, the relationship between the burn-in voltage and the voltage $V_{EXT}$ is represented by curve 604. After transistor 216 has been turned on, the relationship between the burn-in voltage and the voltage $V_{EXT}$ is illustrated by curve 606 ($V_{EXT} > (V_{LA} - \Delta)*2$) indicating logical high $V_{BINEN}$ or burn-in condition where $V_{EXT2} = (V_{EXT}/2) + \Delta > V_{LA}$, or $V_{EXT} > 2*V_{LA} - 2*\Delta$. $2*\Delta$. As the transistor 216 is being turned off, the relationship between the burn-in voltage and the voltage $V_{EXT}$ is illustrated by curve 608. Curves 608 and 604 are separated by approximately 300 millivolts which represent the effect of transistors 210, 212 and 214 being switched into and out of the voltage divider circuits, namely, P-channel transistors 202, 204, 206, and 208. Since matching transistors is easier than adjusting transistor parameters and since $V_{LA}$ is derived from a constant voltage reference source, the burn-in signal is extremely accurate and does not depend on the process or temperature. The burn-in signal is precise in that the same $V_{EXT}$ is reached every time transistor 216 is turned on. The magnitude of $\Delta$ is less significant than the burn-in entry voltage as long as the hysteresis effect is achieved.

Transistors 202, 204, 206, 208, 210, 212, 214 and 412 may have a width to length ratio of 3 microns to 30 microns. Transistor 216 may have a width to length ration of 30 microns to 2 microns. Transistor 414 may have a width to length ratio of 3 microns to 200 microns; transistor 410 may have a length to width ratio of 10 microns to 3 microns. Transistors 101 and 102 may have a width to length ratio of 20 microns to 1.5 microns. Transistors 104 and 106 may have a width to length ratio of 20 microns to 2 microns. Transistor 105 may have a width to length ratio of 15 microns to 3 microns. Transistor 406 may have a width to length ratio of 10 microns to 3 microns. Capacitors 408, 416, 420 and 422 may have a width to length ratio of 20 microns to 10 microns, which may be from either type of transistors. Diode 418 which may be formed from a P-channel transistor and may have a width to length ratio of 50 microns to 1 micron.

Table 1 illustrates the advantages of the present invention. The exit point and entry point and hysteresis for various temperatures and models are illustrated and the table indicates clearly that the entry points do not vary by more than 20 millivolts with the voltage $V_{LA}$ being constant at 3.3 volts. The hysteresis is at least 380 microvolts.

|  | MSIG 125° C. | MSIG −10° C. | PSIG 125° C. | PSIG −10° C. |
| --- | --- | --- | --- | --- |
| ENTRY POINT | 6.693V | 6.687V | 6.687V | 6.667V |
| EXIT POINT | 6.198V | 6.308V | 6.141V | 6.238V |
| HYSTERESIS | 0.495V | 0.379V | 0.546V | 0.429V |

Other Embodiments

Although the present invention and its advantages have been described in detail, it should be understood that various changes, substitutions and alterations can be made herein without departing from the spirit and scope of the invention as defined by the appended claims.

What is claimed is:

1. A memory device to provide a burn-in detection signal, comprising:

a first reference generator circuit for producing a first reference voltage;

a first voltage divider circuit coupled to said first reference generator circuit to divide said first reference voltage to form a first divided reference voltage;

a second reference generator circuit for producing a second reference voltage;

a comparator coupled to said first voltage divider circuit and said second reference generator circuit for comparing said first divided reference voltage and said second reference voltage and for responding to said comparison of said first divider reference voltage and said second reference voltage to reduce said divided reference voltage, wherein said comparator includes a transistor to switch a second voltage divider circuit in parallel to a portion of said first voltage divider circuit.

2. A memory device to provide a burn-in detection signal as in claim 1, wherein said second voltage divider circuit includes a plurality of transistors.

3. A burn-in detection circuit to provide a burn-in detection signal, comprising;

an input circuit to receive a first reference voltage and a second reference voltage;

a first voltage divider circuit coupled to said input circuit to divide said first reference voltage to form a first divided reference voltage;

a comparator coupled to said circuit and said first voltage divider circuit to compare said second referenced voltage and said first divided reference voltage and for responding to said comparator of said first divided reference voltage and said second reference voltage to reduce said divided reference voltage, wherein said comparator includes a transistor to switch a second voltage divider circuit in parallel to a portion of said first voltage divider circuit.

4. A burn-in detection circuit to provide a burn-in detection signal as in claim 3, wherein said second voltage divider circuit includes a plurality of transistors.

* * * * *